United States Patent
Sibille et al.

(10) Patent No.: US 12,412,052 B2
(45) Date of Patent: Sep. 9, 2025

(54) CONTACTLESS COMMUNICATION METHOD BETWEEN AN OBJECT AND A READER USING ACTIVE LOAD MODULATION

(71) Applicant: STMicroelectronics France, Montrouge (FR)

(72) Inventors: Florent Sibille, Grenoble (FR); Marc Houdebine, Crolles (FR)

(73) Assignee: STMicroelectronics France, Montrouge (FR)

( * ) Notice: Subject to any disclaimer, the term of this patent is extended or adjusted under 35 U.S.C. 154(b) by 145 days.

(21) Appl. No.: 18/486,373

(22) Filed: Oct. 13, 2023

(65) Prior Publication Data

US 2024/0135119 A1 Apr. 25, 2024
US 2024/0232549 A9 Jul. 11, 2024

(30) Foreign Application Priority Data

Oct. 21, 2022 (FR) ........................................ 2210964

(51) Int. Cl.
*H04L 7/033* (2006.01)
*G06K 7/10* (2006.01)

(52) U.S. Cl.
CPC ........ *G06K 7/10297* (2013.01); *H04L 7/0331* (2013.01)

(58) Field of Classification Search
CPC .............. G06K 7/10297; H04L 7/0331; H04L 27/0014; H04L 2027/0016; H03L 2207/06; H03L 7/093; H04B 5/45; H04B 5/0081; H04B 5/0037; H04W 4/80
See application file for complete search history.

(56) References Cited

U.S. PATENT DOCUMENTS

| | | | |
|---|---|---|---|
| 2011/0260839 A1* | 10/2011 | Cook | G06K 19/07749 340/10.4 |
| 2018/0110018 A1 | 4/2018 | Yu et al. | |
| 2018/0269931 A1* | 9/2018 | Hershko | H04B 5/26 |
| 2019/0230611 A1 | 7/2019 | Houdebine | |
| 2020/0099554 A1* | 3/2020 | Houdebine | H03L 7/085 |

OTHER PUBLICATIONS

Choke, T., et al., "A 3.4Mbps NFC Card Emulator Supporting 40mm2 Loop Antenna," RMO4A-5, 2017 IEEE Radio Frequency Integrated Circuits Symposium, Jun. 4-6, 2017, 4 pages.

* cited by examiner

*Primary Examiner* — Vernal U Brown
(74) *Attorney, Agent, or Firm* — Slater Matsil, LLP

(57) ABSTRACT

In one embodiment, an object can communicate contactlessly with a reader using active load modulation. The method includes detecting a sensing magnetic field emitted by the reader, initializing a phase-locked loop of the object, detecting a stopping of the sensing magnetic field emitted by the reader before initializing the phase-locked loop of the object is complete, calibrating an oscillator of the phase-locked loop on the basis of an internal clock of the object, detecting a new sensing magnetic field of the reader after calibrating the oscillator, and implementing the phase-locked loop to adjust the phase of the oscillator after detecting a new sensing magnetic field.

20 Claims, 4 Drawing Sheets

CONTACTLESS COMMUNICATION METHOD BETWEEN AN OBJECT AND A READER USING ACTIVE LOAD MODULATION

CROSS-REFERENCE TO RELATED APPLICATIONS

This application claims the benefit of French Application No. 2210964, filed on Oct. 21, 2022, which application is hereby incorporated herein by reference.

TECHNICAL FIELD

Implementations and embodiments of the invention relate to near field communication, that is to say contactless.

BACKGROUND

Near field communication (also known by the acronym NFC) is a short distance high-frequency wireless communication technology, which makes it possible to exchange data between two contactless devices over a short distance for example in the order of 10 cm.

NFC technology is an open technology platform standardized in the standard ISO/IEC 18092 and ISO/IEC 21481 but incorporates many already existing standards such as for example the type A and type B protocols defined in the standard ISO-14443 that may be communication protocols that can be used in NFC technology.

Near field communication may be performed between a reader and an object that may be in card-emulation mode. The reader is then configured to generate a magnetic field through its antenna that is generally, in the standards conventionally used, a sine wave at 13.56 MHz. The strength of the magnetic field is for example between 0.5 and 7.5 amperes/meter Root Mean Square (RMS).

Near field communication may be performed according to an active mode of operation. In this mode of operation, the reader and the object both generate an electromagnetic field. Generally, this mode of operation is used when the object is provided with its own power source, for example a battery, as is the case in a mobile cellular telephone that is then in card-emulation mode.

SUMMARY

Embodiments provide a contactless communication method between an object and a reader using active load modulation.

According to one aspect, a method of contactless communication between an object and a reader uses active load modulation. The method includes emitting by the reader a sensing magnetic field and then detecting a sensing magnetic field by the object. A phase-locked loop of object is initialized. A stopping of the field of the reader is detected before the end of initializing the phase-locked loop of the object. The oscillator of the phase-locked loop of the object is calibrated on the basis of an internal clock of the object. Then a new sensing magnetic field of the reader is detected and the phase-locked loop is implemented to adjust the phase of the oscillator in order to make it possible for the object to respond to the reader.

Such a method can make it possible to initialize the frequency of the oscillator of the phase-locked loop of the object when a rapid-sensing reader is detected. This initialization makes it possible to define the frequency of the oscillator of the phase-locked loop on the basis of an internal clock of the object. Thus, the phase-locked loop is prepared to emit a response more rapidly to the reader when it emits a new field to sense the presence of the object. Indeed, during the detection of the new field, the object may only adjust the phase of the signal generated on that of the field generated by the reader, because the frequency of the signal generated by the oscillator of the phase-locked loop is already that desired. In particular, the calibration of the frequency of the oscillator may take between 200 µs (microseconds) and 300 µs whereas the adjustment of the phase of the oscillator may simply take between 10 µs and 20 µs. By responding to the reader within the sensing period of the reader, the object may initialize a communication with the reader.

Such a method therefore can make it possible for an object to be able to communicate with a reader even if the time for initializing its phase-locked loop is longer than the sensing period of the reader.

In an advantageous implementation, the calibration of the oscillator is performed by measuring an output frequency of the oscillator then by comparing the measured frequency with a desired frequency, then by calibrating the frequency of the oscillator depending on a result of the comparison.

As a variant, the calibration of the oscillator is performed by using a frequency-locked loop to lock the frequency of the oscillator onto the frequency of the internal clock.

For example, the calibration may include an implementation of the frequency-locked loop to calibrate and lock the frequency of the oscillator on the basis of a value stored in a register, when a stopping of the sensing magnetic field of the reader is detected before the end of initialization. Preferably, the phase-locked loop is implemented when a new sensing magnetic field of the reader is detected to adjust the phase of the oscillator. Advantageously, the phase-locked loop is implemented when a new sensing magnetic field of the reader is detected to lock the frequency-locked loop that controls the oscillator.

According to another aspect, an object is configured to be able to carry out a contactless communication with a reader by using active load modulation. The object comprises an internal clock, a detector configured to detect a sensing magnetic field of a reader, and a phase-locked loop that includes an oscillator and is configured to lock a phase of the oscillator onto the detected magnetic field of the reader. The phase-locked loop is configured to be initialized when a sensing magnetic field is detected by the detector. A system for calibrating the frequency of the oscillator of the phase-locked loop is configured to calibrate the frequency of the oscillator on the basis of the internal clock when the detector detects a stopping of the sensing magnetic field of the reader before the end of initializing the phase-locked loop of the object and then to adjust the phase of the oscillator when a new sensing magnetic field of the reader is detected in order to be able to respond to the reader.

In an advantageous embodiment, the calibration system is configured to measure an output frequency of the oscillator and to compare the measured frequency with a desired frequency, then to calibrate the frequency of the oscillator depending on a result of the comparison.

As a variant, the calibration system includes a frequency-locked loop configured to lock the frequency of the oscillator onto the frequency of the internal clock.

Advantageously, the calibration system is configured to implement the frequency-locked loop to calibrate and lock the frequency of the oscillator on the basis of a value stored in a register, when the detector detects a stopping of the sensing magnetic field of the reader before the end of initializing the phase-locked loop of the object, and then implement the phase-locked loop when a new sensing magnetic field of the reader is detected to adjust the phase of the oscillator in order to be able to respond to the reader.

The calibration system can be configured to implement the phase-locked loop when a new sensing magnetic field of the reader is detected to lock the frequency-locked loop that controls the oscillator.

BRIEF DESCRIPTION OF THE DRAWINGS

Further advantages and features of the invention will become apparent on studying the detailed description of embodiments, which are in no way restrictive, and the appended drawings wherein.

DETAILED DESCRIPTION

Figure 1:
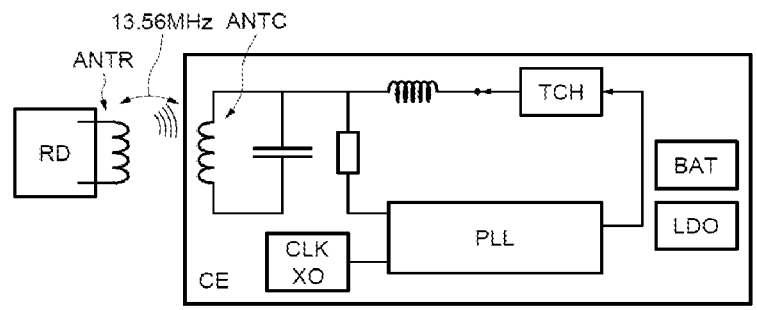
FIG. 1 illustrates an embodiment of a near field communication system.

As discussed above, near field communication may be performed between a reader and an object that may be in card-emulation mode. The reader is configured to generate a magnetic field through its antenna. In an active mode, the reader and the object both generate an electromagnetic field. Generally, this mode of operation is used when the object is provided with its own power source, for example, a battery, as is the case in a mobile cellular telephone that is then in card-emulation mode. In particular, near field communication may be carried out by using Active Load Modulation (ALM). Active load modulation requires a synchronization of the signals between the reader and the object.

The reader is configured to emit an electromagnetic field and the object is configured to modulate an amplitude of the field without interference. In order to respond to the reader, the object generates a signal synchronized with the field of the reader so as to be in phase with the field of the reader. The reader will generate a sufficiently stable field to be able to detect low variations of its field depending on the distance between the reader and the card emulator.

In reader mode or in card-emulation mode, the object generates a clock the most specific possible and that makes it possible to ensure the communication with a minimum of energy. For this, the presence of spurious tones should be reduced or even avoided in the clock generated.

In this embodiment, the object includes a phase-locked loop. The phase-locked loop comprises an oscillator locked in phase and in frequency on the basis of a signal having a reference frequency that may be different from 13.56 MHz. The signal having the reference frequency may be a signal coming from the field generated by the reader. The oscillator is locked so as to obtain as output of the phase-locked loop a signal having a desired frequency, for example, of 13.56 MHz. The oscillator is then locked so as to generate a signal having a multiple frequency of the desired frequency, for example, a frequency of 64×13.56 MHz for a desired frequency of 13.56 MHz. The object can also include a circuit making it possible to divide the frequency of the signal generated by the oscillator so as to obtain a signal at the desired frequency, for example 13.56 MHz.

The reader is configured to regularly emit a sensing magnetic field to initiate a communication with an object. The object is configured to lock the oscillator of the phase-locked loop onto the frequency of the field of the reader. Once the frequency and the phase of the oscillator have been calibrated, then the object is configured to respond by generating a magnetic field having the same frequency and the same phase as the sensing magnetic field of the reader on the basis of the clock signal generated as output of the phase-locked loop to communicate with the reader.

Generally, the sensing magnetic field of the reader is emitted long enough, for example, for a period of 5 milliseconds, so that the object initializes its low-dropout regulators and so that the phase-locked loop finishes locking its oscillator onto the field of the reader.

Some readers have an operation that does not completely respect NFC technology and can also utilize aspects discussed herein.

Readers can be configured to sense the presence of a card very rapidly, in relation to NFC technology standards. Such a reader is configured to regularly sense if a card is present close to the reader. For this, in the same way as described above, the reader emits a magnetic field that it modulates in order to emit a response request then waits for a response if the card is present close by. Nevertheless, such a reader is configured to emit its field for a short duration before sending its response request. Yet, during this short period, a card-emulation mode object does not have time to initialize to lock the phase and the frequency of its field onto the field of the reader. In this case, the reader does not receive a response from the object even if the latter is present close to the reader. The object therefore cannot start a communication with the reader.

Embodiments provide a method making it possible for an object to be able to communicate with a reader rapidly sensing the presence of a card close by.

FIG. 1 illustrates an embodiment of a near field communication system SYS. The system SYS includes a reader RD and an object CE that may be in card-emulation mode for a near field communication. The object CE may be a multi-function telephone, a connected watch, or any other device that uses NFC, whether compliant with standards or not. The object CE is configured to communicate by using Active Load Modulation (ALM). Active load modulation requires a synchronization of signals between the reader RD and the object CE.

In particular, the reader RD includes an antenna ANTR configured to generate a magnetic field having a given frequency, for example, in the order of 13.56 MHz.

The object CE includes an antenna ANTC configured to receive the magnetic field emitted by the reader RD and to emit a magnetic field. The object also includes a battery BAT making it possible to power its various elements.

The object CE includes a phase-locked loop PLL. The phase-locked loop PLL comprises an oscillator DCO. This oscillator DCO may be a digital control or analogue control oscillator. For example, the digital control oscillator may be a ring oscillator. The phase-locked loop PLL is configured to lock the oscillator DCO in phase and in frequency onto the frequency and the phase of the field of the reader. The phase-locked loop PLL thus makes it possible to generate a signal having the same frequency and the same phase as those of the reader.

The object CE also includes a transmission chain TCH configured to form the signals to be emitted via the antenna to communicate with the reader. The transmission chain uses the clock signal to generate a signal to be emitted having the same frequency and the same phase as the field of the reader.

The object CE includes at least one low-dropout regulator (LDO regulator) configured to power the phase-locked loop.

The object CE includes a low power mode wherein some of its circuits are not supplied with energy, particularly the LDO regulator powering the phase-locked loop.

The object CE is configured to exit the low power mode when it receives a magnetic field emitted by a reader RD.

In particular, the object CE is configured to initialize its phase-locked loop PLL when it receives a field of the reader RD. If the sensing magnetic field of the reader is emitted for long enough so that the phase-locked loop PLL is initialized, then the object CE is configured to receive the request of the reader RD and respond to it in order to initiate a communication by using the clock signal generated by the phase-locked loop PLL locked onto the field of the reader RD.

As a variant, the reader RD may be a rapid sensing reader. The sensing magnetic field of the reader is then emitted not long enough to make it possible to initialize the phase-locked loop PLL of the object CE.

Nevertheless, in the embodiment illustrated, the object CE is even so configured to communicate with a rapid sensing reader RD.

In particular, the object CE is configured to detect if a received field stops before the end of initializing the phase-locked loop PLL. In this case, the object CE knows that the reader RD is a rapid sensing reader.

If the object CE has detected that the reader RD is a rapid sensing reader, the object CE is configured to calibrate the frequency of the oscillator DCO of the phase-locked loop PLL by using a frequency of a signal generated by an internal clock CLKXO. There are various ways to perform the calibration of the oscillator DCO of the phase-locked loop PLL. FIGS. 3 to 6 described in the following illustrate two different ways for performing this calibration.

Once the oscillator has been calibrated, the object CE is configured to wait for a next emission of a sensing magnetic field of the reader RD.

Once the new sensing magnetic field of the reader RD has been detected by the object CE, the latter is configured to implement the phase-locked loop PLL to calibrate the phase of the oscillator of the phase-locked loop PLL on the phase of the sensing magnetic field. When the phase of the oscillator DCO is calibrated, the object CE is configured to initiate a communication with the reader RD.

Figure 2:
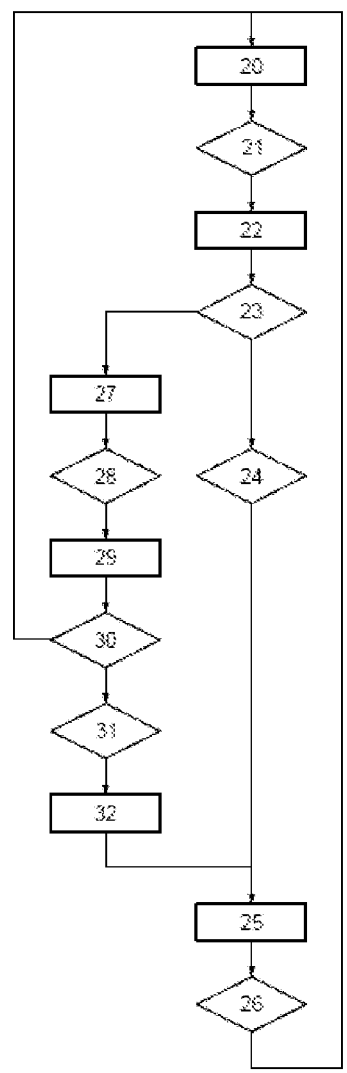
FIG. 2 illustrates a method implemented by an object to communicate with a reader in a contactless communication.

FIG. 2 illustrates a method implemented by an object CE, such as that described above, to communicate with a reader RD in a contactless communication.

The method comprises a step 20 wherein the object CE is in its low power mode.

The method also comprises a test 21 wherein the object CE detects a field of the reader RD.

Subsequently, if the object CE detects a field of the reader RD during the test 21, then the method comprises a step 22 of initializing the object CE. During this step of initializing the object CE, the latter activates the various elements needed to initiate a communication with the reader RD. For example, the object CE activates an LDO regulator. The activation of the LDO regulator makes it possible to power the phase-locked loop PLL. During the initialization step 22, the object CE carries out a calibration and a locking of the phase-locked loop PLL onto the frequency and the phase of the magnetic field.

Then, the method comprises a test 23 for determining the presence of a field of the reader RD. During this step, the object CE evaluates if the field of the reader RD is still detected or not.

If the object CE detects that the field of the reader RD is still present, then the object CE deduces from it that the reader RD is configured to sense long enough to make it possible to initialize the object CE.

Thus, in this case, the method includes a test 24 making it possible to know if the calibration and the locking of the phase-locked loop PLL are finished.

Once the frequency and the phase of the oscillator DCO of the phase-locked loop have been locked onto the frequency and the phase of the magnetic field, and if the field of the reader RD is still present, the method comprises a communication step 25 wherein the object CE communicates with the reader RD.

Once the communication has finished, the object CE detects the end of the field of the reader RD during the test 26, then returns to step 20 in its low power mode until the next detection of magnetic field.

If during step 22 (initializing the object CE including the calibration of the phase-locked loop) the field disappears, then the object CE no longer detects the field of the reader RD during the test 23. The object CE deduces from it that the reader RD is a sensing reader that is not configured to sense long enough to make it possible to initialize the object CE.

In this case, the method includes a step 27 wherein the phase-locked loop PLL is implemented to lock the oscillator DCO onto a desired frequency, for example, on the order of 64*13.56 MHz on the basis of an internal clock of the object CE. In particular examples, the internal clock may be configured to generate a clock signal of frequency between 13 MHz and 76 MHz. The method includes a test 28 making it possible to verify that the oscillator is correctly calibrated on the desired frequency.

Subsequently, once the oscillator DCO has been calibrated on the desired frequency, the method includes a step 29 wherein the object CE starts a time counter while waiting for a next detection of a field.

The method subsequently includes a test 30 wherein the value of the time counter is evaluated in relation to a predetermined duration. If the time counter reaches the predetermined duration without the object CE detecting during a test 31 a magnetic field, then the object CE considers that the reader RD is no longer close by. The object CE then returns to its low power mode of step 20.

If the object CE detects during the test 31 a magnetic field before the end of the predetermined duration, then the method includes a step 32 wherein the phase-locked loop PLL locks the frequency and the phase of the oscillator DCO onto the frequency and the phase of the magnetic field.

Once the frequency and the phase of the oscillator DCO have been locked, the method comprises a communication step wherein the object CE communicates with the reader RD.

Once the communication has finished, the object CE detects the end of the field of the reader RD during the test 26, then returns to step 20 in its low power mode until the next detection of magnetic field.

Such a method makes it possible to initialize the frequency of the oscillator DCO of the phase-locked loop of the object CE when a rapid sensing reader RD is detected. This initialization makes it possible to define the frequency of the oscillator DCO of the phase-locked loop PLL on the basis of an internal clock CLKXO of the object. Thus, the phase-locked loop PLL is prepared so that the object CE can emit a response more rapidly to the reader when it emits a new response request for sensing the presence of a card. Indeed, during the detection of the new field, the object CE may only adjust the phase of the signal generated on that of the field generated by the reader, because the frequency of the signal generated by the oscillator DCO of the phase-locked loop PLL is already that desired. In particular, the calibration of the frequency of the oscillator may take between 200 µs (microseconds) and 300 µs whereas the adjustment of the phase of the oscillator may simply take between 10 µs and 20 µs. By responding to the reader RD within the sensing period of the reader, the object may communicate with the reader.

Such a method therefore makes it possible for the object CE to be able to communicate with a reader RD even if the time for initializing its phase-locked loop PLL is longer than the sensing period of the reader RD.

Figure 3:
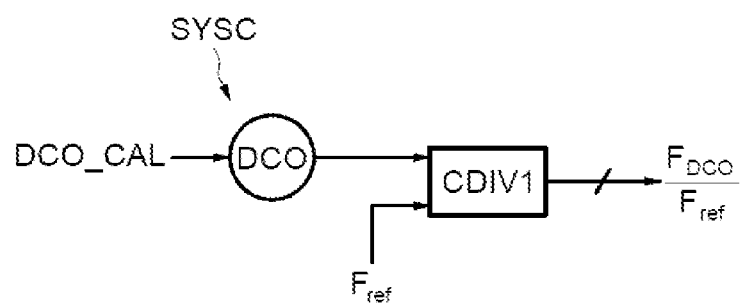
FIG. 3 illustrates a first embodiment of a system for controlling an oscillator of a phase-locked loop.

FIG. 3 illustrates a first embodiment of a system for controlling the oscillator DCO of the phase-locked loop PLL making it possible to lock the oscillator DCO on the basis of an internal clock when the detected field comes from a rapid sensing reader RD. In particular, the object CE is configured to control the frequency of the oscillator DCO of the phase-locked loop PLL with a control value dco_cal. The oscillator DCO has an output connected to a first input of a counter-divider CDIV1. The counter-divider CDIV1 also includes a second input configured to receive a clock signal of frequency F_ref. This clock signal is generated by an internal clock of the object CE. The counter-divider CDIV1 is configured to generate a signal F_DCO/F_ref.

Figure 4:
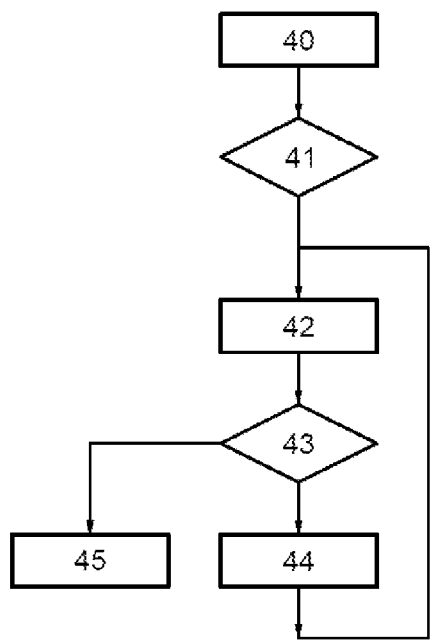
FIG. 4 illustrates a method to control an oscillator of a phase-locked loop.

The object CE is configured to implement a machine with a finite number of states. This machine with a finite number of states makes it possible to define the control value dco_cal. In particular, FIG. 4 illustrates a method that may be implemented by the machine with a finite number of states to control the oscillator DCO of the phase-locked loop PLL. In this embodiment, the method includes a step 40 wherein the control system is in low power mode and initializes the control of the calibration of the oscillator dco_cal at its minimal value. The method subsequently includes a test 41 that makes it possible to start the calibration of the phase-locked loop required in step 22 described above.

The method subsequently includes a step 42 of measuring the output frequency of the oscillator DCO of the phase-locked loop PLL.

Then, the method includes a test 43 wherein the measured output frequency of the oscillator DCO is compared with the desired frequency, for example in the order of 64*13.56 MHz. If the measured frequency is lower than the desired frequency, then the method comprises a step 44 wherein the control value is incremented so as to increase the frequency of the oscillator DCO. Following the incrementation, a measurement of the frequency is carried out again in order to verify if the frequency of the oscillator has reached its value.

If the frequency of the oscillator reaches the desired frequency, then the calibration finishes at step 45.

Figure 5:
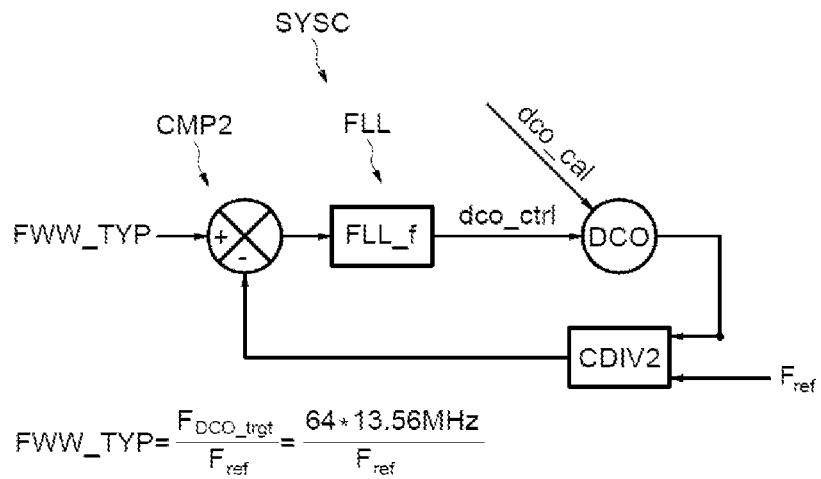
FIG. 5 illustrates a second embodiment of a system for locking an oscillator of a phase-locked loop.

FIG. 5 illustrates a second embodiment of a system for locking the oscillator DCO of the phase-locked loop PLL making it possible to lock the oscillator DCO on the basis of an internal clock when the detected field comes from a rapid sensing reader RD.

The control system is a frequency-locked loop FLL configured to receive as input a value FWW_TYP. This value FWW_TYP may particularly be stored in a register. The value FWW_TYP is a predefined value equal to F_(DCO_trgt)/F_ref, where F_(DCO_trgt) corresponds to the desired frequency for the oscillator, for example 64*13.56 MHz, F_ref corresponds to the frequency of the internal clock.

The control system is produced by a frequency-locked loop FLL controlling the same oscillator DCO as the phase-locked loop. The frequency-locked loop FLL includes a counter-divider CDIV2. The counter-divider CDIV2 includes a first input connected to the output of the oscillator DCO, and a second input configured to receive the clock signal of reference frequency F_ref generated by the internal clock CLKXO. The counter-divider CDIV2 is configured to generate a signal F_DCO/F_ref. The frequency-locked loop FLL also includes a comparator CMP2 having a first non-reversing input configured to receive the value FWW_TYP, and a second input configured to receive the signal F_DCO/F_ref. The frequency-locked loop FLL also includes a loop filter FLL_f having an input connected to the output of the comparator, and an output connected to the oscillator DCO.

Figure 6:
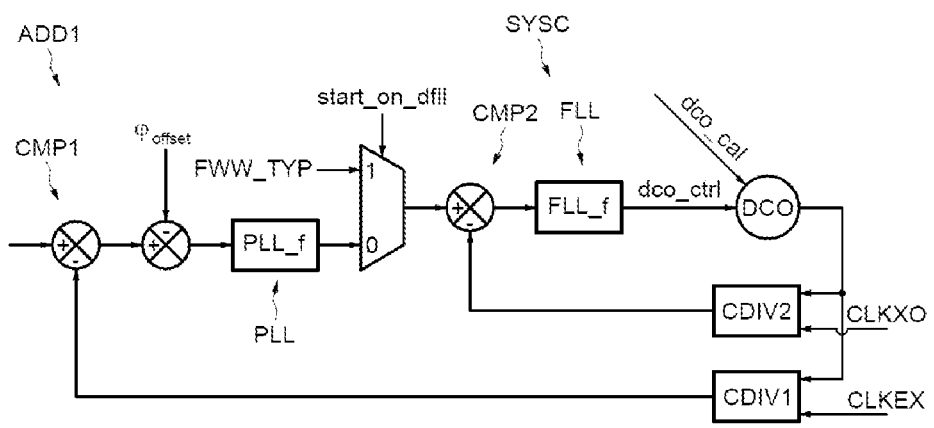
FIG. 6 illustrates a frequency-locked loop of a control system integrated with a phase-locked loop.

FIG. 6 illustrates the frequency-locked loop of the control system integrated with the phase-locked loop to control the same oscillator DCO. In this example, the oscillator DCO is configured to output an output oscillator signal having a frequency equal to N*13.56 MHZ. N is preferably an integer equal to or greater than 1, for example, equal to 64. N may also be advantageously fractional in combination with a delta sigma converter to recover the mean value.

The phase-locked loop PLL comprises a loop filter PLL_f, the controlled oscillator DCO, and a first counter-divider CNT1 receiving on the one hand the output signal of the oscillator and on the other hand the clock signal CLKEX extracted from the field of the reader.

The output of the first counter-divider CDIV1 is looped back via a first comparator CMP1. Moreover, optionally, an adder ADD1 makes it possible to add a phase offset φoffset, representative of the phase offset caused by circuitry disposed between the antenna ANTC and the phase-locked loop PLL.

The frequency-locked loop FLL here comprises as described above the loop filter FLL_f, the oscillator DCO, the counter-divider CDIV2 receiving at one end the output signal of the oscillator DCO and at another end a reference clock signal CLKXO at the reference frequency F_ref delivered by the internal clock CLKXO of the object CE.

The two loop filters PLL_f and FLL_f here are filters that have a conventional structure (typically integrating stabilizer filters) and, in order to avoid as much as possible any stability problems, preferably designed in such a way that the cut-off frequency of the loop FLL is greater than the cut-off frequency of the loop PLL. Thus, the temporal responses of the two loops PLL and FLL are managed by the loop PLL.

The output of the counter CDIV2 is looped back onto the input of the loop filter FLL_f via a comparator CMP2.

In the present case, whereas the output of the first counter CDIV1 delivers the phase offset between the output signal of the oscillator and the clock signal CLEX extracted from the field of the reader, one of the levers of the counter CDIV1 makes it possible to deliver the clock signal DVCLK the frequency of which is divided by N, for example, here 64, in relation to the frequency of the signal DCOS in such a way as to obtain the frequency of 13.56 MHz at the nearest tolerance.

A switch is further placed between the loop filter PLL_f and the comparator CMP2. The switch includes a first input '0' configured to be connected to the output of the loop filter PLL_f, and a second input '1' configured to receive the value FWW_TYP. The switch also includes an input configured to receive the selection signal start_on_dfll. The switch has an output connected to the input of the frequency-locked loop. The output signal of the switch thus corresponds to the output value of the loop filter PLL_f when the value of the selection signal start_on_dfll is equal to 0 and to the value FWW_TYP when the value of the selection signal start_on_dfll is equal to 1.

The switch is configured to make it possible to only operate the frequency-locked loop in the absence of field of the reader (the value of the selection signal is then equal to 1).

The switch is configured to make it possible to operate the phase-locked loop when the new sensing magnetic field of the reader is detected.

Figure 7:
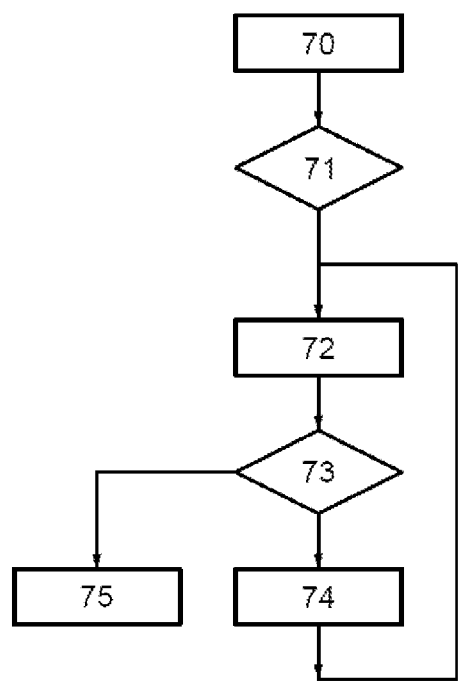
FIG. 7 illustrates a method stem to control an oscillator of a phase-locked loop.

FIG. 7 illustrates a method implemented by the control system to control the oscillator DCO of the phase-locked loop PLL by using the frequency-locked loop FLL. In particular, the method includes a step 70 wherein the control system is in low power mode and initializes the control of the oscillator dco_cal at a minimum value. The method subsequently includes a test 71 that makes it possible to start the calibration of the phase-locked loop required in step 22 described above. To calibrate the phase-locked loop, the control system executes in step 72 the frequency-locked loop for a predetermined duration on the basis of the value FWW_TYP. Subsequently, the method includes a test 73 wherein the control value dco_ctrl of the oscillator is compared with the value of the center frequency dco_mid, particularly 64*13.56 MHz. The test 73 makes it possible to allow time for the frequency-locked loop to stabilize. If the control value dco_ctrl of the oscillator is lower than the value dco_mid, this means that the frequency of the oscillator is lower than the desired frequency. If the frequency of the oscillator is lower than the desired frequency, then the method includes a step 74 wherein the value dco_cal is incremented, before again allowing time for the frequency-locked loop to attempt to stabilize the frequency of the oscillator, to center the frequency of the oscillator on the center frequency, particularly of 64*13.56 MHz. If the control value dco_ctrl is no longer lower than the value dco_mid during the comparison test 73, this means that the oscillator has reached the desired frequency. The calibration then finishes at step 75.

In this mode of implementation, the oscillator is controlled by the frequency-locked loop FLL. Nevertheless, as a variant, the oscillator may only be controlled by the phase-locked loop PLL.

What is claimed is:

1. A method of operating an object for contactless communication between the object and a reader using active load modulation, the method comprising:
   detecting a sensing magnetic field emitted by the reader;
   initializing a phase-locked loop of the object;
   detecting a stopping of the sensing magnetic field emitted by the reader before initializing the phase-locked loop of the object is complete;
   calibrating an oscillator of the phase-locked loop on the basis of an internal clock of the object;
   after calibrating the oscillator, detecting a new sensing magnetic field of the reader; and
   after detecting the new sensing magnetic field, implementing the phase-locked loop to adjust the phase of the oscillator.

2. The method according to claim 1, further comprising responding to the reader after implementing the phase-locked loop to adjust the phase of the oscillator.

3. The method according to claim 1, wherein calibrating the oscillator comprises:
   measuring an output frequency of the oscillator;
   comparing the measured output frequency with a desired frequency; and
   calibrating the frequency of the oscillator depending on a result of the comparing.

4. The method according to claim 1, wherein calibrating the oscillator comprises using a frequency-locked loop to lock the frequency of the oscillator onto the frequency of the internal clock.

5. The method according to claim 4, wherein calibrating the oscillator comprises implementing the frequency-locked loop to calibrate and lock the frequency of the oscillator on the basis of a value stored in a register after detecting the stopping of the sensing magnetic field emitted by the reader.

6. The method according to claim 5, wherein the phase-locked loop is implemented in response to detecting the new sensing magnetic field of the reader.

7. The method according to claim 5, wherein the phase-locked loop is implemented by locking the frequency-locked loop that controls the oscillator in response to detecting the new sensing magnetic field of the reader.

8. An object capable of carrying out a contactless communication using active load modulation, the object comprising:
   an internal clock;
   a magnetic field detector; and
   a phase-locked loop that includes an oscillator and is configured to lock a phase of the oscillator onto the detected magnetic field;
   wherein the object is designed to initialize the phase-locked loop when sensing of a magnetic field is detected by the magnetic field detector, to calibrate the frequency of the oscillator of the phase-locked loop on the basis of the internal clock when the detector detects that sensing of the magnetic field has stopped before initializing of the phase-locked loop is complete, and to then adjust the phase of the oscillator when a new sensing magnetic field is detected.

9. The object according to claim 8, wherein the object is designed to measure an output frequency of the oscillator, to compare the measured output frequency with a desired frequency, and to then calibrate the frequency of the oscillator depending on a result of the comparison.

10. The object according to claim 9, further comprising a frequency-locked loop configured to lock the frequency of the oscillator onto the frequency of the internal clock.

11. The object according to claim 10, wherein the object is designed to:
   implement the frequency-locked loop to calibrate and lock the frequency of the oscillator on the basis of a value stored in a register when the detector detects that sensing of the magnetic field has stopped; and then
   implement the phase-locked loop when the new sensing magnetic field is detected to adjust the phase of the oscillator.

12. The object according to claim 11, wherein the object is designed to implement the phase-locked loop when the new sensing magnetic field is detected to lock the frequency-locked loop that controls the oscillator.

13. The object according to claim 9, further comprising a counter divider having a first input coupled to an output of the oscillator and a second input coupled to a node carrying a reference signal operating at the desired frequency.

14. The object according to claim 8, further comprising:
a counter divider having a first input coupled to an output of the oscillator and a second input coupled to a node carrying a reference signal;
a register;
a comparator having a first input coupled to the register and a second input coupled to an output of the counter divider; and
a frequency locked loop coupled between an output of the comparator and an input of the oscillator.

15. The object according to claim 8, further comprising:
a first counter divider having a first input coupled to an output of the oscillator and a second input coupled to the internal clock;
a second counter divider having a first input coupled to an output of the oscillator and a second input coupled to receive a clock signal extracted from the magnetic field;
a first loop filter;
a first comparator having a first input coupled to an output of the second counter divider and an output coupled to the first loop filter;
a register;
a multiplexer having a first input coupled to the register and a second input coupled to an output of the first loop filter;
a second comparator having a first input coupled to an output of the multiplexer and a second input coupled to an output of the first counter divider; and
a second loop filter coupled between an output of the second comparator and an input of the oscillator.

16. The object according to claim 8, further comprising a system configured to calibrate the frequency of the oscillator of the phase-locked loop on the basis of the internal clock when the detector detects that sensing of the magnetic field has stopped before initializing of the phase-locked loop is complete, and to then adjust the phase of the oscillator when the new sensing magnetic field is detected.

17. An object configured to be able to carry out a contactless communication with a reader by using active load modulation, the object comprising:
an internal clock;
means for detecting a sensing of a magnetic field of the reader;
a phase-locked loop including an oscillator and being configured to lock a phase of the oscillator onto the detected magnetic field of the reader, the phase-locked loop being configured to be initialized when sensing of the magnetic field is detected; and
means for calibrating the frequency of the oscillator of the phase-locked loop configured to calibrate the frequency of the oscillator on the basis of the internal clock when the sensing of the magnetic field of the reader is stopped before initializing the phase-locked loop is complete, and to then adjust the phase of the oscillator when a new sensing magnetic field of the reader is detected in order to be able to respond to the reader.

18. An object capable of carrying out a contactless communication using active load modulation, the object comprising:
an internal clock;
a magnetic field detector;
a phase-locked loop that includes an oscillator;
a first counter divider having a first input coupled to an output of the oscillator and a second input coupled to the internal clock;
a second counter divider having a first input coupled to an output of the oscillator and a second input coupled to receive a clock signal extracted from a magnetic field detected by the magnetic field detector;
a first loop filter;
a first comparator having a first input coupled to an output of the second counter divider and an output coupled to the first loop filter;
a register;
a multiplexer having a first input coupled to the register and a second input coupled to an output of the first loop filter;
a second comparator having a first input coupled to an output of the multiplexer and a second input coupled to an output of the first counter divider; and
a second loop filter coupled between an output of the second comparator and an input of the oscillator.

19. The object according to claim 15, wherein the first loop filter comprises a phase locked loop and wherein the second loop filter comprises a frequency locked loop.

20. The object according to claim 15, further comprising an adder coupled between the first comparator and the first loop filter.

* * * * *